United States Patent [19]
Coulson

[11] Patent Number: 5,365,189
[45] Date of Patent: Nov. 15, 1994

[54] DRIFT FREE LOW NOISE COMPOSITE AMPLIFIER AND METHOD OF OPERATION THEREOF

[75] Inventor: Larry D. Coulson, Edmonton, Canada

[73] Assignee: The Governors of the University of Alberta Intellectual Property & Contracts Office University of Alberta, Edmonton, Canada

[21] Appl. No.: 32,488

[22] Filed: Mar. 17, 1993

[51] Int. Cl.$^5$ .......................... H03F 3/68; H03F 3/85; H03F 1/00
[52] U.S. Cl. .................................. 330/126; 330/256; 330/69; 330/149; 330/151
[58] Field of Search ................. 330/126, 252, 69, 149, 330/151, 9, 283

[56] References Cited

U.S. PATENT DOCUMENTS 4,284,965  8/1981  Higashi et al. ...................... 330/126

FOREIGN PATENT DOCUMENTS 750055   1/1967   Canada.
1068795  12/1979  Canada.
1211166  9/1986   Canada .............................. 328/167
0034606  3/1983   Japan ................................. 330/149

OTHER PUBLICATIONS

Keithley Instruments, U.S. Price Schedule for Test Instruments and Accessories, Effective Oct. 1, 1991, Technical data, 11 pages.
Compsite amplifiers yield high speed and low offset by Jim Williams Linear Technology Corp., EDN,m Jan. 22, 1987, pp. 130-150,12 pages.
Stabilization of Wide-Band Direct-Current Amplifiers for Zero and Gain by Edwin A. Goldberg, RCA Review, Jun., 1950, pp. 296-300, 5 pages.
ITHACO product brochure, 1211 Current Preamplifier, p. 62 and 63, date not known but predates application filing date.
ITHACO product brochure, Model 1212 Current Preamplifier, IPS 159 Oct. 1989.

*Primary Examiner*—William L. Sikes
*Assistant Examiner*—Fetsum Abraham
*Attorney, Agent, or Firm*—Anthony R. Lambert

[57] ABSTRACT

A composite amplifier includes a discrete active gain element with a feedback circuit that provides for low drift and low offset, but which also has low noise, short settling time and high bandwidth. This is accomplished in part by providing an attenuator in the feedback circuit and by providing a voltage source for the source of the discrete active gain element. The feedback circuit is connected between the gate and the source of the active gain element and is responsive to a change in voltage at the gate to supply a voltage of equal but opposite magnitude to the source. The source has an impedance whose Johnson noise is less than the noise of the active gain element. A differential amplifier in the feedback is constructed in multiple stages with a first stage having lower gain than a second stage.

16 Claims, 3 Drawing Sheets

DRIFT FREE LOW NOISE COMPOSITE AMPLIFIER AND METHOD OF OPERATION THEREOF

FIELD OF THE INVENTION

This invention relates to composite amplifiers, and more particularly to drift free and offset free composite amplifiers, as well as to a method of eliminating drift in a composite amplifier while keeping the noise level low.

BACKGROUND AND SUMMARY OF THE INVENTION

An ideal amplifier has no drift, no voltage offset, no noise, zero settling time and infinite bandwidth. By comparison, an operational amplifier has extremely low drift and offset voltage, but very poor noise, long settling time and low bandwidth. An amplifier made from discrete components has low noise, short settling times and excellent bandwidth but poor voltage offset and drift.

A composite amplifier combines the best traits of the operational amplifier and the discrete, while suppressing the worst traits of both. However, to date there has not been provided a composite amplifier that achieves all of the desirable traits of an ideal amplifier.

Some examples of prior art amplifiers with drift and offset compensation include the amaplifier described by Edwin A. Goldberg, "Stabilization of Wideband DC Amplifiers for Zero and Gain", RCA Review June 1950, in which there is provided a differential amplifier with a circuit used for drift compensation including a mechanical chopper, an AC coupled amplifier, a synchronous rectifier and a low pass filter coupled between the inputs of the differential amplifier. The drift compensation circuit monitors the input of the differential amplifier. If the input drifts by a voltage $V_d$ then this voltage is converted by the chopper into an AC voltage, amplified by the AC amplifier and rectified by the rectifier. The resulting voltage $-V_d$ is then applied to the other of the inputs of the differential amplifier where it tends to cancel the drift $V_d$. By using an AC amplifier the drift of the AC amplifier is eliminated from the drift compensation circuit. The rectifier and low pass filter smooths the pulsed output of the AC amplifier and yields a DC voltage to be applied to the input of the differential amplifier.

One difficulty with this prior art design is that one side of the differential amplifier adds noise to the input of the amplifier. Another difficulty is that the chopper injects a current into the amplifier's input which has the effect of adding noise to the amplifier.

A similar design to the Goldberg design is shown in Canadian patent no. 750,055 issued to Staunton, in which a drift free amplifier is provided which has a memory device (capacitor) in one of the inputs of the amplifier, and a feedback resistor in the other of the inputs. The memory device is periodically charged from the feedback resistor so that it provides a potential source to offset any drift in the amplifier. The switching of the capacitor also tends to inject noise into the input of the amplifier, as with the Goldberg device. Also, the capacitor output has no gain and therefore the correction voltage will not be as effective as if it were amplified.

More recently, Jim Williams, "Composite Amplifiers Yield High Speed and Low Offset", EDN, Jan. 22, 1987, has described several composite amplifiers. For example, a composite amplifier with drift correction is shown in FIG. 2 of the Williams article in which a differential amplifier is provided with a feedback circuit connected to one of its inputs. The feedback circuit includes a low pass filter and a differential amplifier. The feedback circuit supplies a correction voltage to the other of the inputs of the differential amplifier. Like the second stage of the differential amplifier in the Goldberg design, $Q_2$ in FIG. 2 of the article tends to add noise to the amplifier. Integrated circuit IC2 also injects unwanted noise into the input of the amplifier.

In another example, shown in FIG. 5 of the Williams article, a composite differential amplifier includes a feedback circuit having an offset gain correcting device LT1008 and a low pass filter. This device suffers from three difficulties. Firstly, whatever gain is selected for the high speed amplifier, the same gain must be matched for the compensation circuit, leading to difficulties in constructing the devices. Secondly, the filters at the inputs of offset gain correcting device must be matched, or settling time may be affected. Thirdly the offset correcting amplifier injects an unwanted noise into the amplifier.

In some prior art amplifiers, the amplifier includes more than one stage and the voltage noise from an offset compensation stage is amplified by the later stages, thus degrading the performance of the amplifier and requiring precise matching of the components of the amplifier.

The present invention provides a composite amplifier that has all the desirable traits of low drift, low offset, short settling time, high bandwidth, high open loop gain, and low noise. The offset and drift correction circuitry increases the open loop gain but does not, to any measurable amount, increase the input noise of the active device, increase the offset current, inject input noise current or inject input noise charge.

Further, this offset and drift correction circuitry can be embodied in an integrated circuit to be used in wide variety of discrete amplifiers. The design of the discrete amplifier can be done independently of the drift and offset correction circuitry so any type of discrete design criteria can be easily achieved.

In one aspect of the invention, therefore, there is provided a discrete active gain element having a feedback circuit that includes an attenuator. In another aspect of the invention, there is provided a discrete active gain element having a feedback circuit including a unique operational amplifier, that is formed from a first differential amplifier and at least a second differential amplifier that has a higher gain than the first. This is believed contrary to teaching in the art in which a later stage has lower gain than an earlier stage to avoid undue addition of noise from the second stage.

These and other features of the invention are described in the detailed description that follows and the claims that follow the detailed description.

BRIEF DESCRIPTION OF THE DRAWINGS

There will now be described a preferred embodiment of the invention, with reference to the drawings, by way of illustration, in which like numerals denote like elements and in which.

DETAILED DESCRIPTION OF PREFERRED EMBODIMENT

Figure 1:
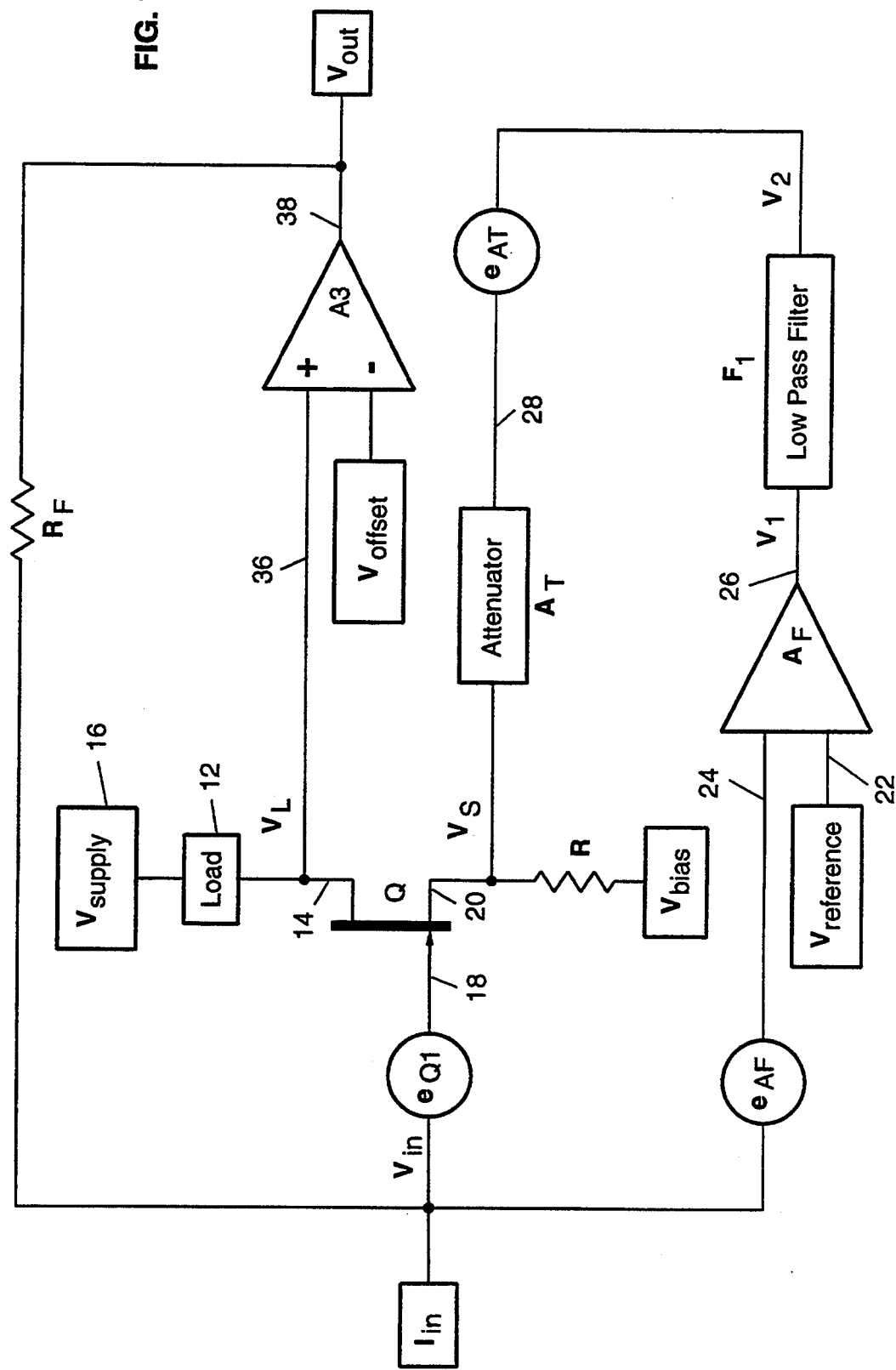
FIG. 1 is a diagram showing the major functional components of a composite amplifier according to the invention.

Referring to FIG. 1, there is shown an active gain element, consisting of a discrete device Q, which may be for example a JFET, MOSFET, PNP transistor or NPN transistor, with a load 12 connected between its drain 14 and a voltage supply, $V_{supply}$, 16. $V_{supply}$ provides power for the discrete device Q and the load 12. In the case of a transistor, the terminology of gate, source and drain should be read as referring to base, collector and emitter.

Figure 2:
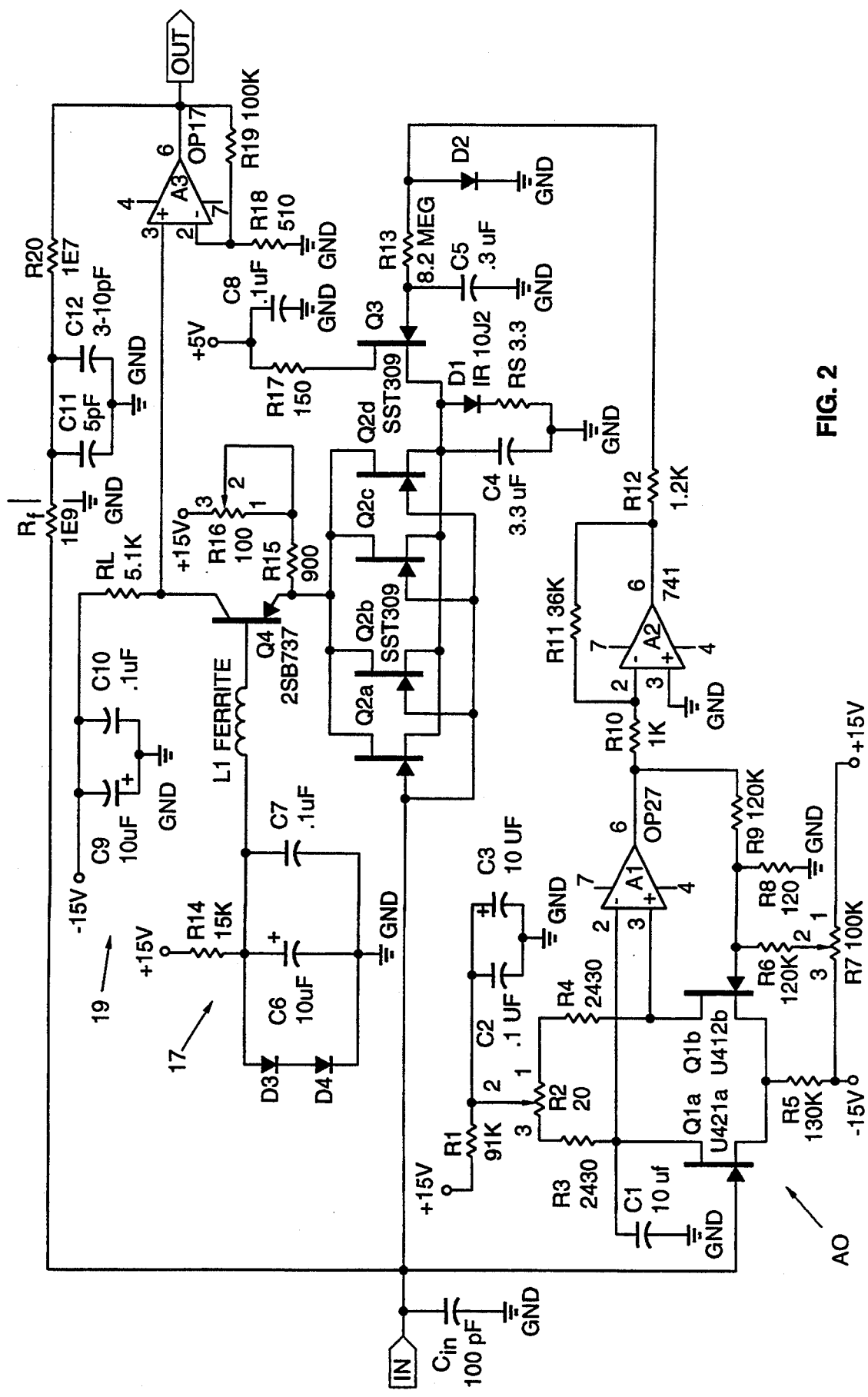
FIG. 2 is an electrical diagram showing suitable components for use in the composite amplifier of FIG. 1.

As shown in FIG. 2, the discrete device Q may be for example one or a plurality of discrete devices Q2a, Q2b, Q2c and Q2d which may each be a JFET SST309 or J309 or similar device or combination of devices. There may also be a common gate device Q4 (for example transistor 2SB737 or 2N4403) connected between Q and the load 12, the total combination having a voltage gain of $A_Q = V_L/V_{in}$, where $V_L$ is the voltage at the load and $V_{in}$ is the voltage at the input of Q. As shown in FIG. 2, a common gate device Q4 or cascode including biasing circuit 17, composed of R14, diodes D3 and D4, C6, C7 and ferrite bead L1, may be used to isolate noise from the load and the amplifier A3 from the input to Q and may be used to set the operating point of Q. The collector voltage of the discrete device Q4 may be adjusted using the circuit provided by R15, variable resistance R16 and the associated +15 voltage point.

The load 12 is shown in FIG. 2 as RL, while $V_{supply}$ is provided by the conventional bypass circuit 19 including C9 and C10 and the −15 voltage point.

Discrete device Q is provided with a feedback circuit (feedback means) connected between its gate 18 and source 20 that includes a differential amplifier $A_F$, low pass filter F1 and attenuator $A_T$.

The differential amplifier $A_F$, preferably formed of a series connected pair of differential amplifiers as shown in FIG. 2, has one input 22 connected to $V_{Reference}$ and the other input 24 connected to the base or gate of Q. $V_{reference}$ defines the input voltage $V_{in}$, and is usually between −2 and +2 volts. $V_{reference}$ is preferably set to zero as shown in FIG. 2. The output 26 of $A_F$ is connected to the low pass filter F1. The total gain of $A_F$ may be defined as $A_{AF}$.

As shown in FIG. 2, the amplifier $A_F$ is preferably configured as a pair of differential amplifiers A0 and A1 and a final gain stage A2. The first differential amplifier A0 is formed from a pair of JFETs Q1a and Q1b with a common source with resistance R5 and drain consisting of R3, R4, variable resistance R2, R1 and voltage 15 V, with capacitors C1, C2 and C3 as shown. R3 and C1 should be chosen, in accordance with principles known in the art, to limit the noise at high frequency (greater than 1 kHz). Variable resistors R2 and R7 should be adjusted for a near zero temperature coefficient of the amplifier A0 as is known in the art. Q1a and Q1b provide a pair of differential inputs to op amp A1 (preferably model no. OP27) with a feedback loop including Q1b, R9, R8, R6 and variable resistor R7. A1 is connected to the third differential amplifier A2 through resistor R10. A2 is an op amp configured as a voltage amplifier with R11 in the feedback loop and R12 at the output, the output of A1 being amplified by A2. It is preferable, and believed novel in a multistage amplifier and in any event in a feedback for a transresistance amplifier, that the gain of the first differential amplifier A0 be lower than the gain of the second differential amplifier A1. Amplifier A0's low gain is necessary to keep the injected input noise charge of A0 low. The overall gain of the pair of Q1a and Q1b should be less than 1, preferably about 0.1, with the gain of A1 greater than 1, preferably greater than 10, the ratio of the gain of A2 to the gain of A1 therefore being greater than 100.

The components of low pass filter F1, as for example resistor R13 and capacitor C5 in FIG. 2, are selected to permit DC and a defined range of low frequency signals below a chosen cutoff frequency $f_c$ to pass unattenuated from the output 26 of $A_F$ to the input 28 of attenuator $A_T$. Preferably, $f_c$ should be less than and preferably five times less than $(f_o*e_{Rf})/(A_{AF}*e_{AF})$, where $f_o$ may be selected according to known principles in the art, as described for example in U.S. Pat. No. 3,787,776 to Cath et al, or calculated as $f_o = (2\pi R_f*C_{in})$, where $C_{in}$ is the total input capacitance of Q and the input source, and where $e_{AF}$ is the input referred voltage noise of the differential amplifier pair forming $A_F$, $e_{Rf}$ is the voltage noise of the feedback resistor $R_f$ and $A_{Af}$ is the amplification of device $A_F$. Throughout this patent document $A_x$ is the amplification of device $A_x$. In this patent document, frequencies higher than $F_c$ will be referred to as high frequencies. It is preferred that frequencies higher than the cutoff frequency $F_c$ are attenuated in proportion to the ratio of the frequency of the signal to the cutoff frequency. A diode D2 is preferably used to limit the voltage supplied to the gate of Q3.

Attenuator $A_T$ is an amplifier with a gain $(V_s/V_2)$ less than 1, and less than and preferably five times less than the ratio of the voltage noise of Q $(e_Q)$ to the voltage noise of the attenuator $(E_{AT})$. $V_s$ is the voltage at the source of Q. $V_2$ is the voltage at the output of amplifier A2. The attenuator $A_T$, is shown in FIG. 2 and may be formed for example of discrete device Q3, for example JFET SST309 or J309, having drain voltage supply formed by R17, a +5 voltage source and bypass capacitor C8 connected to ground. The attenuator $A_T$ is connected between the low pass filter F1 and the source 20 of discrete device Q. As shown in FIG. 2, if the attenuator is a JFET, then its source should be connected to the source of discrete device Q. A resistance R is connected between the source of Q and a bias voltage source $V_{bias}$. In the case of an active gain element requiring zero gate source bias, then the voltage source may be zero voltage. The value of resistance R is selected so that its Johnson noise (expressed in nv/√Hz) is less than, and preferably at least 5 times less than, the noise of Q $(e_Q)$. Resistance R consists of all resistances between the source of Q and ground, and may include for example a diode D1 (for example diode IR10J2 as shown in FIG. 2) connected through a resistance RS to ground. A bypass consisting of C4 from the source of Q2 to ground may also be provided to further remove noise at higher frequencies. Voltage source $v_{bias}$, or equivalently the diode D1 and resistance RS, is chosen to allow a current to flow through Q by establishing an operating point in Q's linear region. As is known in the art, a voltage source provides an essentially constant voltage no matter what current is drawn from it. The attenuator may be formed of other components. For example, it is possible but not desirable to use as an attenuator an optoisolator, a MOSFET or a variable resistor providing a voltage divider effect. The output impedance of the attenuator should be in the order of 4 ohms. The feedback circuit, including the amplifier $A_F$, filter F1 and the attenuator $A_T$, should invert the signal.

Connected to the load 12 is a DC amplifier A3, having one or more stages, which has a positive gain of value from one to several million. Preferably, but not necessarily, the amplifier A3 includes an offset adjustment, indicated by $V_{offset}$, to reduce the DC value of $V_L$ (appearing at the drain of discrete device Q) to appear as $V_{Reference}$ at $V_{out}$, where $V_{out}$ is the output voltage of the composite amplifier. In particular, $V_{offset}$ or $V_L$ should be adjusted such that the differential amplifier $A_F$ is operating in the linear region over the temperature range of use. If a folded cascode is used as shown in FIG. 2, such that $V_L$ is nearly zero, then offset adjustment is not necessary.

The non inverting input 36 of amplifier A3 is connected to the load 12. The output 38 from amplifier A3 is connected through feedback resistor $R_f$ to the gate of discrete device Q. The value of $R_f$ is preferably between 1 and $10^{14}$ ohms, with a value selected according to the intended application of the composite amplifier. Amplifier A3 has a conventional construction as illustrated in FIG. 2, in which an integrated circuit for example OP17, with its associated feedback resistances R18 and R19, output resistance R20 and supply bypasses C11 and C12, is used as A3.

The operation of the composite amplifier is best described at three frequency ranges.

For frequencies from DC to $F_c$ a drift in any part of the discrete paths $V_{bias}$, R, Q, Load, $V_{supply}$, $V_{offset}$, or A3 will cause the input voltage $V_{in}$ to depart from $V_{reference}$. The feedback circuit continuosly monitors the input voltage $V_{in}$ and responds to the change in voltage at the gate to supply a voltage of equal but opposite magnitude to the source in the following manner. $V_{in}$'s departure from $V_{reference}$ will be felt by $A_F$ and amplified as an amplified error voltage or signal V1. The filter F1 will filter this error voltage and pass the filtered voltage as V2 to the attenuator $A_T$ which reduces or attenuates this error voltage and impresses it upon R as $V_s$. The polarity of $V_s$ is now opposite of $V_{in}$ so it will cause the current flowing in Q to change in a direction to reduce $V_{in}$ to a near $V_{reference}$ value. This negative feedback action will reduce the drifts caused by R, $V_{bias}$ and Q by a factor $A_{AF}*A_{AT}$ and will reduce the offsets and drifts caused by Load, $V_{supply}$ and $V_{offset}$ by a factor $A_{AF}*A_{AT}*A_Q$. Output offsets of A3 will be reduced by a factor of $A_{AF}*A_{AT}*A_Q*A_{A3}$. Because the gain of the drift cancellation can be so great, the inherent offset, drift and input referred voltage noise $e_{AF}$ of $A_F$ completely dominate the composite amplifier. Thus the excellent drift and offset values of the differential amplifier dominate the composite amplifier.

For frequencies beyond the product $F_c*A_{AF}*A_{AT}$ the input referred voltage noise of $A_F$ ($e_{AF}$) is attenuated by the filter F1 so its effects are not felt at all by the composite amplifier, and the noise source of Q ($e_Q$) now dominates the composite amplifier. The noise source of the attenuator $e_{AT}$ is reduced to insignificant levels by the attenuator circuitry, and the drift corrector circuitry and its noise sources ($e_{AF}$, $e_{AT}$) have been effectively disconnected from the discrete section. As a result, the excellent noise, high bandwidth and short settling time of the discrete section dominate the composite amplifier.

For frequencies between the ranges described, there is a linear transition between the effects of those two ranges.

The low value of R, preferably 2 ohms, degrades the gain $A_Q$ only slightly and adds a negligible 2% more noise to Q's input. An optional capacitor C4 connected from Q's source to ground can completely eliminate the noise of R at high frequencies. The cancellation method described is independent of the discrete circuitry and therefore does not affect the high frequency operation in any way. As noted in FIG. 2, the resistor R and $V_{bias}$ can be replaced by a forward biased diode. $V_{offset}$ is defined as $V_{reference} - V_{in}$.

The composite amplifier thus described may be used in association with other circuit elements to provide for various functions as is known in the art.

For example, a resistance may be provided at the input to the amplifier which would have the effect of causing the amplifier to amplify voltage. For another example, the amplifier may be configured as a charge sensitive amplifier with $R_f$ bridged or replaced with a capacitor and a capacitor at the input to the amplifier. For a further example, with the amplifier configured as a charge sensitive amplifier, omission of the capacitor at the input will configure the amplifier as an integrator.

Figure 3:
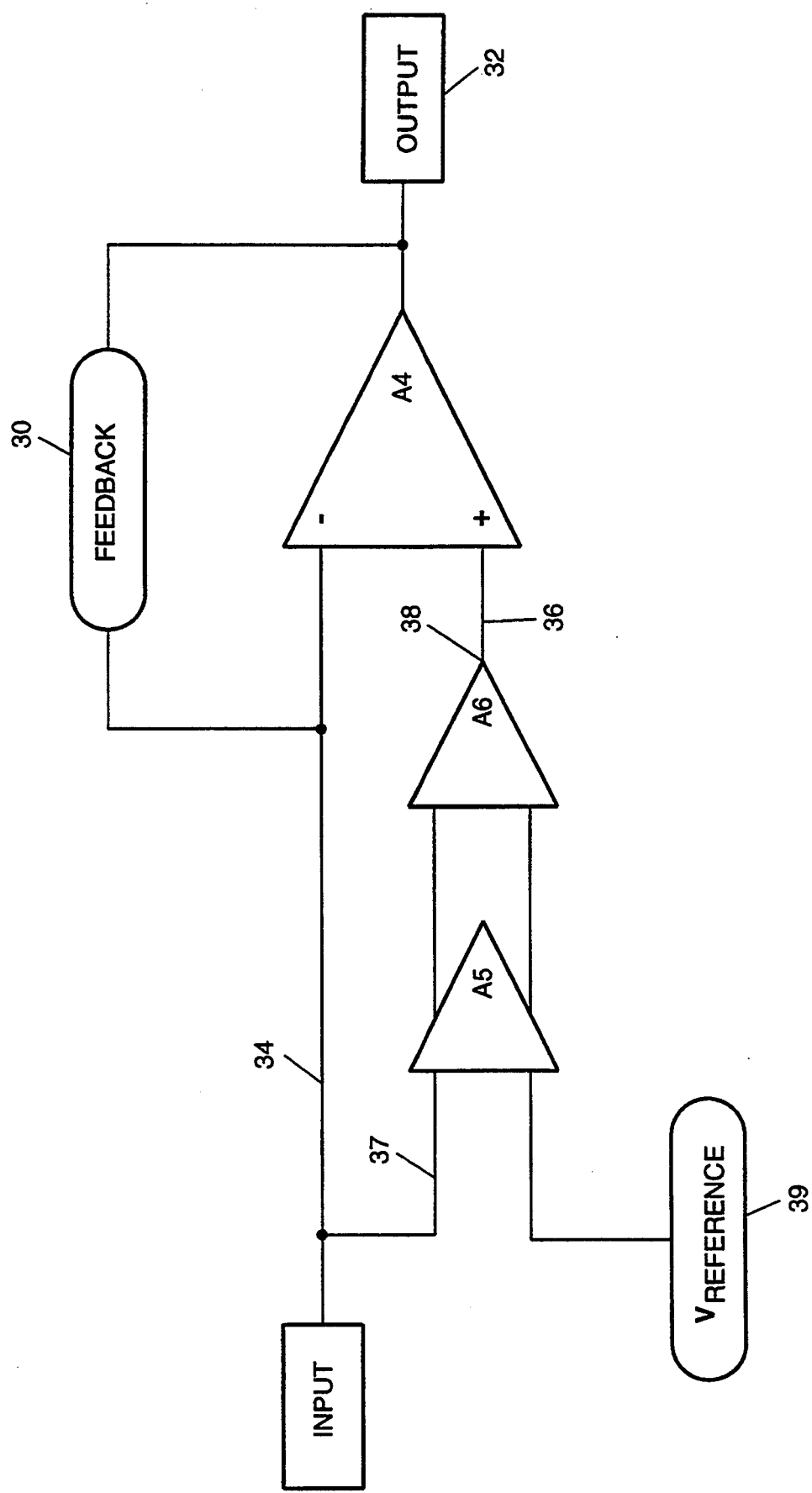
FIG. 3 is a diagram illustrating the major functional components of a differential amplifier according to one aspect of the invention.

The amplifier consisting of A0 and A1 with $A_{A0} < A_{A1}$ may be used in the feedback of conventional differential amplifiers and is not restricted to utility with the attenuator $A_T$ and discrete device Q with voltage source. Referring to FIG. 3 there is shown a conventional differential amplifier A4 having a conventional feedback loop 30 and output 32. The differential amplifier A4 also has a first input 34 and a second input 36. A pair of differential amplifiers A5 and A6 are connected in series between the first input 34 and the second input 36. One input 37 of the differential amplifier A5 is connected to the input 34 and the other to a reference voltage 39. The output 38 of the differential amplifier A6 is connected to the second input 36 of the differential amplifier A4. The gain $A_{A5}$ of the differential amplifier A5 is less than the gain $A_{A6}$ of the differential amplifier A6. Preferably $A_{A5}$ is less than 1. $A_{A6}$ is preferably greater than one, and at least 100 times greater than $A_{A5}$. As noted before, the lower gain of A5 lowers the injected charge noise to the input of A4. A5 is preferably a dual JFET. The amplifier A5 should be biased for near zero temperature coefficient, in accordance with principles known in the art. The gain of A6 is chosen large enough to obtain desirable offset and drift correction of A4.

Alternative Embodiments

A person skilled in the art could make immaterial modifications to the invention described and claimed in this patent without departing from the essence of the invention.

I claim:

1. A composite amplifier comprising:
   an active gain element having a gate, a drain and a source;
   an external voltage reference source;
   feedback circuit means connected between the gate and the source, the feedback circuit being responsive to a change in voltage at the gate relative to the external voltage reference to supply a voltage of equal but opposite magnitude to the source; and
   a voltage source connected to the source of the active gain element and the voltage source having an impedance whose Johnson noise is less than the noise of the active gain element.

2. The composite amplifier of claim 1 in which the feedback means includes:
   a differential amplifier having first and second inputs, the first input being connected to the gate of the active gain element and the second input being connected to a reference voltage;
   a low pass filter connected to the output of the differential amplifier; and
   an attenuator connected to the output of the low pass filter.

3. The composite amplifier of claim 2 in which the differential amplifier includes first and second stages, the first stage having gain less than the second stage.

4. The composite amplifier of claim 3 in which the gain of the first stage is about 100 times less than the gain of the second stage.

5. The composite amplifier of claim 1 in which the voltage source has an impedance whose Johnson noise is no more than one-fifth of the noise of the active gain element.

6. The composite amplifier of claim 5 in which the active gain element is a FET.

7. A composite amplifier comprising:
   an active gain element having a gate, a drain and a source;
   feedback means connected between the gate and the source responsive to a change in voltage at the gate to supply a voltage of equal but opposite magnitude to the source; and
   the feedback means including a differential amplifier having first and second inputs and an output, the first input being connected to the gate of the active gain element and the second input being connected to a reference voltage, a low pass filter connected to the output of the differential amplifier, and an attenuator connected to the output of the low pass filter.

8. The composite amplifier of claim 7 in which the differential amplifier includes a first stage and a second stage, the first stage having gain less than the second stage.

9. The composite amplifier of claim 7 in which the attenuator is a FET and the source of the active gain element is connected to a voltage source.

10. The composite amplifier of claim 8 in which the attenuator is a FET and the source of the active gain element is connected to a voltage source.

11. The composite amplifier of claim 9 in which the voltage source has an impedance whose Johnson noise is less than the noise of the active gain element.

12. A method of providing feedback resistance to a discrete active gain element having a drain, gate and source, comprising the steps of:
    continuously monitoring and amplifying the difference between the gate voltage and a reference voltage to produce an amplified signal;
    filtering the amplified signal to remove high freqencies to produce a filtered signal;
    attenuating the filtered signal to produce an attenuated signal; and
    providing the attenuated signal to the source of the discrete active gain element.

13. The method of claim 12 further comprising the step of applying an essentially constant voltage to the source no matter what current is drawn by the source.

14. The method of claim 13 in which filtering the amplified signal includes attenuating frequencies higher than the cutoff frequency $F_c$ in proportion to the ratio of the frequency of the signal to the cutoff frequency.

15. The method of claim 12 in which amplifying the difference between the gate voltage and the reference voltage includes:
    amplifying the difference between the gate voltage and the reference voltage with a first amplifier having a first gain to produce an output; and
    amplifying the output with a second amplifier having a second gain greater than the first gain.

16. The method of claim 15 in which the first gain is less than 1 and the second gain is greater than 1.

* * * * *